(12) United States Patent
Steinecke

(10) Patent No.: US 6,842,882 B2
(45) Date of Patent: Jan. 11, 2005

(54) METHOD FOR DETERMINING, ON A BASIS OF A CIRCUIT DIAGRAM OF A DIGITAL CIRCUIT, A CURRENT DRAWN BY THE DIGITAL CIRCUIT DURING AN OPERATION THEREOF

(75) Inventor: Thomas Steinecke, Wörth (DE)

(73) Assignee: Infineon Technologies AG, Munich (DE)

( * ) Notice: Subject to any disclaimer, the term of this patent is extended or adjusted under 35 U.S.C. 154(b) by 215 days.

(21) Appl. No.: 10/199,613

(22) Filed: Jul. 19, 2002

(65) Prior Publication Data

US 2003/0023940 A1 Jan. 30, 2003

(30) Foreign Application Priority Data

Jul. 19, 2001 (DE) .......................... 101 35 284

(51) Int. Cl.[7] .............................. G06F 17/50
(52) U.S. Cl. .................. 716/3; 716/1; 716/4; 716/5
(58) Field of Search .................... 716/3, 1–2, 4–15

(56) References Cited

U.S. PATENT DOCUMENTS 5,477,460 A * 12/1995 Vakirtzis et al. ............... 716/5

OTHER PUBLICATIONS

Hamaoui, A et al. "An Analytical Model for Current, Delay, and Power Analysis of Submicron CMOS Logic Circuits", IEEE Transactions on Circuits and Systems –II: Analog and Digital Signal Processing, vol. 47, No. 10, Oct. 2000, pp 999–1007.*

Chatzigeorgiou, A. et al.: "A Modeling Technique for CMOS Gates", IEEE, vol. 18, No. 5, May 1999, pp. 557–575.

Nabavi–Lishi, A. et al.: "Inverter Models of CMOS Gates For Supply Current And Delay Evaluation", IEEE, vol. 13, No. 10, Oct. 1994, pp. 1271–1279.

Kong, J.T. et al.: "Performance Estimation Of Complex MOS Gates", IEEE, vol. 44, No. 9, Sep. 1997, pp. 785–795.

Cremoux, S. et al.: "Delay–Power Performance Analysis", IEEE, Sep. 1999, pp. 1543–1546.

Kriplani, H. et al.: "Improved Delay And Current Models For Estimating Maximum Currents in CMOS VLSI Circuits", pp. 435–438.

* cited by examiner

Primary Examiner—Vuthe Siek
Assistant Examiner—Magid Y. Dimyan
(74) Attorney, Agent, or Firm—Laurence A. Greenberg; Werner H. Stemer; Ralph E. Locher

(57) ABSTRACT

The current that will be drawn by a digital circuit is predicted on the basis of its schematic circuit diagram. An equivalent circuit is generated, wherein circuit sections of the digital circuit, the output signal levels of which change or can change at the same time, are replaced by an inverter. This renders it possible to determine the current drawn by a digital circuit in a simple, fast and accurate manner even at its design stage.

9 Claims, 2 Drawing Sheets

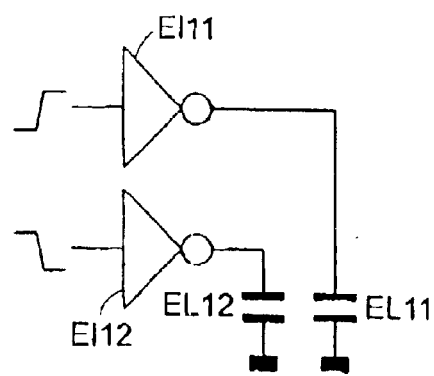
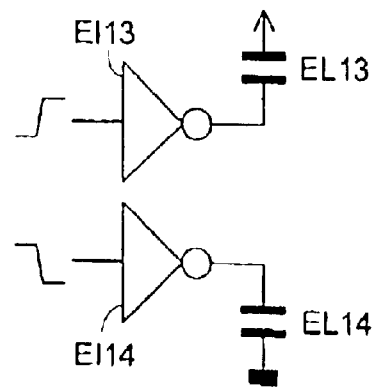
FIG 3
FIG 4
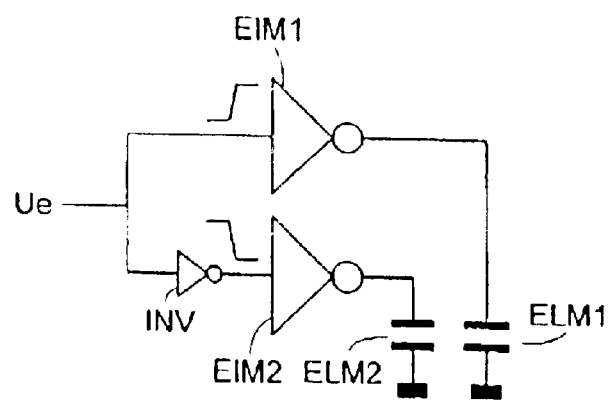
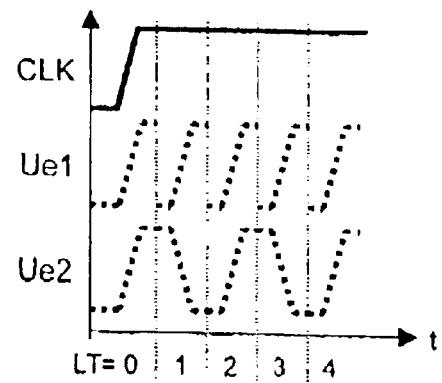
FIG 5
FIG 6

METHOD FOR DETERMINING, ON A BASIS OF A CIRCUIT DIAGRAM OF A DIGITAL CIRCUIT, A CURRENT DRAWN BY THE DIGITAL CIRCUIT DURING AN OPERATION THEREOF

This application claims the benefit of German Patent Application No. 101 35 284.0, filed 19 Jul. 2001, the disclosure of which is incorporated herein by reference.

BACKGROUND OF THE INVENTION

Field of the Invention

The present invention relates to a method by which, on the basis of the circuit diagram of a digital circuit, the current drawn by the digital circuit in its operation can be determined.

Knowing the current, particularly of the maximum current drawn by a digital circuit, is required in order to specify the measures by means of which it can be ensured that this current does not disturb other components of the system containing the digital circuit.

Disturbances due to currents can occur when the currents are of such a magnitude that they lead to fluctuations in the supply voltage. Such fluctuations can lead to the digital circuit itself and/or components of the system containing the digital circuit, which are supplied via the same current source or the same supply lines, not operating correctly.

If the digital circuit is part of an integrated circuit, such measures for preventing disturbances include, by way of example, filters that are integrated into the digital circuit by means of which it is prevented that the current drawn by the digital circuit leads to fluctuations in the supply voltage that supplies the digital circuit and/or other components of the system containing the digital circuit with energy.

The optimum dimensioning of these filters depends on the magnitude of the currents flowing, particularly on the magnitude of the maximum current.

The filters have hitherto been dimensioned on the basis of empirical values. It then happens not infrequently that the dimensioning is quite different from the optimum dimensioning. That is, the filter is frequently considerably oversized or considerably undersized.

If the filter is undersized, the supply voltage fluctuations to be prevented by way of the filter are not or not adequately prevented.

If the filter is oversized, the integrated circuit, or more precisely the semiconductor chip carrying it, becomes larger than is necessary. This is because the essential components of the filter are one or more capacitors and their implementation in an integrated circuit requires a relatively large chip area. The larger the integrated circuit, the more expensive it becomes and even slight increases in price cause considerable additional costs because of the large numbers wherein integrated circuits are produced.

For these reasons, an improved integrated circuit (one which has a correctly dimensioned filter) must frequently be designed if it is found that the filter is oversized or undersized after an integrated circuit has been produced.

This is associated with high expenditure and high costs.

It would be very advantageous, therefore, if there were possibilities of correctly dimensioning the filter at the design stage of the digital circuit. However, such a possibility only exists for digital circuits of relatively simple structure. Such circuits can be simulated by using their back-annotated net list. The net list reproduces the circuit diagram of the digital circuit to be implemented. It contains a list of the components contained in the relevant circuit, and their interconnection. This net list is used for creating the layout of the integrated circuit containing the relevant digital circuit. In addition, the back-annotated net list contains information on existing parasitic capacitances, inductances and resistances which must be taken into account in the practical implementation of the basic digital circuit. On the basis of the back-annotated net list, it can be determined in detail how the digital circuit will behave during its operation. This also makes it possible to determine what currents flow with which input signals.

In the case of complex digital circuits such as, for example, microcontrollers, such simulations are not possible in practice due to the large amounts of data to be processed and the resultant long computing time of the simulation computer.

SUMMARY OF THE INVENTION

It is accordingly an object of the invention to provide a method, which overcomes the above-mentioned disadvantages of the heretofore-known devices and methods of this general type and which renders it possible to determine the current drawn by a digital circuit in a simple, fast and accurate manner during its design stage.

With the foregoing and other objects in view there is provided, in accordance with the invention, a method for determining a current drawn by a digital circuit during an operation of the circuit. The method comprises the following steps:

providing a circuit diagram of the digital circuit;
generating an equivalent circuit by replacing circuit sections of the digital circuit whose output signal levels change or can change simultaneously by an inverter; and
determining the current to be drawn by the digital circuit during an operation thereof based on the equivalent circuit.

In other words, the novel method according to the invention predicts the current by using an equivalent circuit. The equivalent circuit replaces those circuit sections of the digital circuit, the output signal levels of which change or can change at the same time, by an inverter.

An equivalent circuit wherein circuit sections of the digital circuit, the output signal levels of which change or can change simultaneously, are replaced by an inverter exhibits a much simpler structure than the digital circuit replaced by the equivalent circuit. This simple structure of the equivalent circuit makes it possible to determine the current flowing through it, and thus also the current flowing through the digital circuit itself, by conventional means for determining a current from a circuit diagram in a simple, fast and accurate manner.

In accordance with an additional feature of the invention, the equivalent circuit is generated by:

first, partitioning the digital circuit into circuit sections each comprising a number of components;
second, determining which of the circuit sections change or can change their output signal level at the same time; and
third, replacing some or all of the circuit sections which change or can change their output signal level at the same time by a single inverter.

In accordance with another feature of the invention, the circuit sections replaced by an inverter in the equivalent circuit have one or more input connections and one output connection.

In accordance with a further feature of the invention, the circuit sections replaced by an inverter in the equivalent circuit are circuit sections representing logic gates.

In accordance with again another feature of the invention, the equivalent circuit is generated by replacing all circuit sections whose output signal level changes or can change from the low level to the high level at the same time, by a single inverter. Alternatively, or in addition, all circuit sections whose output signal level changes or can change from the high level to the low level at the same time, are replaced by a single inverter in the equivalent circuit.

In accordance with a concomitant feature of the invention, the inverters of the equivalent circuit and loads driven thereby are dimensioned such a current flowing through them is approximately equal to a current flowing through the circuit sections replaced thereby and the loads driven thereby.

Other features which are considered as characteristic for the invention are set forth in the appended claims.

Although the invention is illustrated and described herein as embodied in a method by which, on the basis of the circuit diagram of a digital circuit, the current drawn by the digital circuit in its operation can be determined, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a circuit diagram of a first possibility for configuring the replacement inverters shown in FIG. 2;

FIG. 4 is a circuit diagram of a second possibility for configuring the replacement inverters shown in FIG. 2;

FIG. 5 is a diagram of an equivalent circuit which has been simplified further; and FIG. 6 is a plot graph showing signals used as input signals for the equivalent circuit according to FIG. 5.

DESCRIPTION OF THE PREFERRED EMBODIMENTS

Figure 1:
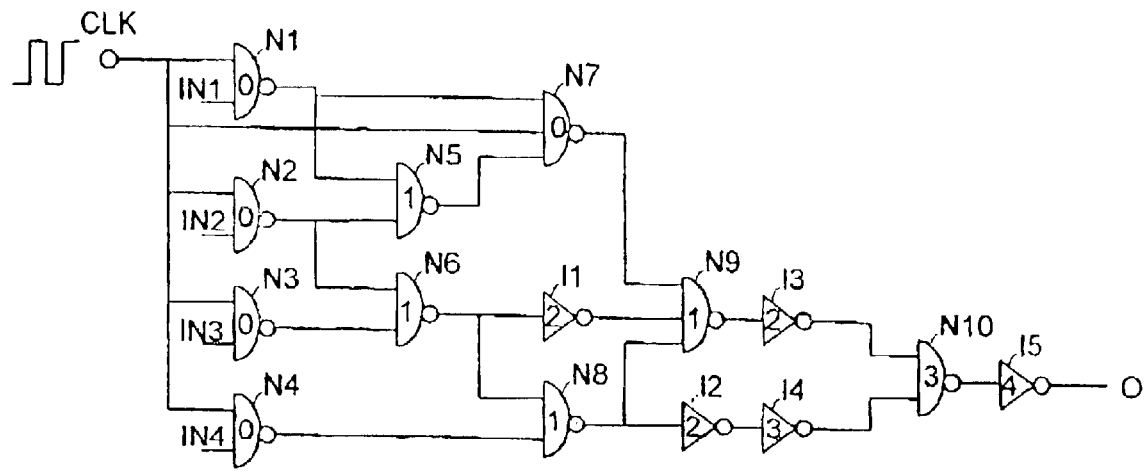
FIG. 1 shows a digital circuit wherein replaceable circuit sections are already replaced with inverters.

In the example considered in the following description, the digital circuit for which the current drawn in its practical use is to be determined on the basis of its circuit diagram is a synchronously clocked digital circuit or, more precisely, a microcontroller or a part (a particular module) of a microcontroller.

It will be understood, however, that the concepts promulgated here and the principles of the method described in the text below can also be used with any other digital circuits.

In the method described herein, the current drawn by a digital circuit in practical use is determined by using an equivalent circuit wherein circuit sections which change or can change their output signal level at the same time are replaced by an inverter.

This is based on the finding that a synchronously clocked digital circuit can be reduced to a multiplicity of inverter functions, i.e., switching operations from the logical level 0 to the logical level 1 and conversely.

In consequence, a digital circuit can be described by a number of inverters called equivalent inverters in the following. Some of the equivalent inverters switch from 0 to 1 and the rest switch from 1 to 0.

For the sake of completeness, it is pointed out that an equivalent circuit constructed by using equivalent inverters is not a full replacement for the digital circuit which is replaced by the equivalent circuit. In particular, the equivalent circuit does not simulate the function of the digital circuit replaced by the equivalent circuit. However, the equivalent circuit is suitable for determining the current drawn by the digital circuit in its practical use. As will be understood more precisely later, the equivalent circuit is generated partially on the basis of estimates of the states prevailing in the digital circuit and events occurring, so that the current which is determined by using the equivalent circuit in general will not exactly correspond to the current actually flowing. However, the differences remain within limits so that a filter preventing supply voltage fluctuations can be dimensioned with sufficient accuracy on the basis of the current thus determined.

The equivalent circuit can be generated with the aid of the information contained in the net list for the digital circuit. For this purpose, in a first step, the digital circuit is partitioned into circuit sections in each case comprising a number of components (particularly into a number of transistors but—if present—also resistors, capacitors, coils etc.);

in a second step, a determination is made which of the circuit sections determined in the first step change or can change their output signal level at the same time;

in a third step, in each case several or all circuit sections of the circuit sections which change or can change their output signal level at the same time are replaced by a single equivalent inverter of corresponding size.

The circuit sections into which the digital circuit is partitioned in the first step are circuit sections having one or more input connections and one or more output connections. In the example considered here, these are circuit sections which represent logic gates such as, for example, AND gates, OR gates, NAND gates, NOR gates, XOR gates, inverters etc. However, it should be pointed out that those circuit sections can also be larger circuit sections (for example circuit sections representing a number of gates) or smaller circuit sections (for example circuit sections representing only a part of a gate).

Naturally, if a circuit diagram containing the circuit sections which can be replaced by equivalent inverters already exists (for example a circuit diagram of the type of the circuit diagram shown in FIG. 1, described later), it is also possible to omit the first step.

In the determination performed in the above-mentioned second step (i.e., which of the circuit sections determined in the first step change or can change their output signal level at the same time), a value which will be referred to as logical depth in the following is allocated to the relevant circuit sections. The logical depth specifies the number of cascaded circuit sections over which a respective circuit section is connected to a clock signal connection of the digital circuit via which the digital circuit is supplied with a clock signal controlling the timing sequence.

In the example considered, only the shortest connection, more precisely the connection containing the fewest other circuit sections, to the clock signal connection is taken into consideration in each case. In the case of circuit sections having a number of input connections, only the input connection, the shortest connection to the clock signal connection of which is the shortest, is taken into consideration. This is handled in this way because this allows a worst-case consideration to be undertaken (short successive switching operations cause greater disturbances than switching operations which are farther apart in time).

It should be clear that the logical depth can also be determined by other means. In particular, it may prove to be advantageous under some circumstances if the logical depth
  is determined by taking into consideration the longest connection to the clock signal connection, or
  is determined by taking into consideration another one than the shortest or longest connection to the clock signal connection, or
  is determined by taking into consideration a mean value which is calculated by taking into consideration the shortest and longest connection to the clock signal connection, or
  is determined by taking into consideration a mean value which is calculated by taking into consideration all connections to the clock signal connection, or
  is determined alternately by taking into consideration the shortest connection, the longest connection or another connection, or
  is determined by taking into consideration a randomly selected connection to the clock signal connection,
the respective mean value being rounded up or down to the next integer number when mean values are used.

Referring now to the figures of the drawing in detail and first, particularly, to FIG. 1 thereof, which illustrates the determination of the logical depth, the circuit includes NAND gates N1 to N10 and inverters I1 to I5. The NAND gates and inverters are circuit sections which can be replaced by equivalent inverters as will be described more precisely later. The configuration is an arrangement obtained after carrying out the above-mentioned first step.

The configuration has input connections IN1 to IN4, an output connection O and a clock signal input connection CLK via which the configuration is supplied with a clock signal. The circuit sections which can be replaced by an inverter, that is to say the NAND gates N1 to N10 and the inverters I1 to I5 are allocated a logical depth in the aforementioned second step. The numbers in the circuit section symbols specify the logical depth which is allocated to the respective circuit sections. Accordingly, logical depth 0 is allocated to NAND gates N1 to N4 and N7, logical depth 1 to NAND gates N5, N6, N8, and N9, logical depth 2 to inverters I1 to I3, logical depth 3 to NAND gate N10 and the inverter I4, and logical depth 4 to inverter I5.

The NAND gates N1 to N4 are allocated the logical depth 0 because in each case one of the input terminals of these is directly connected to the clock signal connection CLK.

The NAND gate N7 is allocated the logical depth 0 because its input terminal which is preceded by the fewest cascaded other gates is connected to the clock signal connection CLK via no other gate, that is to say directly. The fact that the other input terminals of NAND gate N7 are at the same time connected to the clock signal connection CLK via the NAND gate N1 and via the NAND gates N1 and N5 and via the NAND gates N2 and N5 is of no import because only the shortest connections to the clock signal connection CLK are taken into account in the example considered here.

The NAND gates N5 and N6 are allocated the logical depth 1 because their input terminals are connected to the clock signal connection CLK via another gate, more precisely via the NAND gate N1 and, respectively, the NAND gate N2 (input terminals of N5) and, respectively, via the NAND gate N2 and, respectively, the NAND gate N3 (input terminals of N6).

The inverter I1 is allocated the logical depth 2 because its input terminal is connected to the clock signal connection CLK via two other cascaded gates, more precisely via NAND gates N2 and N6 and, respectively, via NAND gates N3 and N6.

The NAND gate N6 is allocated the logical depth 1 because its input terminal, which is preceded by the fewest other cascaded gates, is connected to the clock signal connection CLK via another gate, more precisely via gate N4.

The NAND gate N9 is allocated the logical depth 1 because its input terminal, which is preceded by the fewest other cascaded gates, is connected to the clock signal connection CLK via another gate, more precisely via gate N7. The fact that the relevant input terminal of the NAND gate N9 is also connected to the clock signal connection CLK via NAND gates N1 and N7 and via NAND gates N1, N5 and N7 and via gates N2, N5 and N7 is not considered because only the shortest connections (those containing the fewest gates) to the clock signal connection CLK are taken into consideration in each case in the example under consideration.

The inverter I2 is allocated the logical depth 2 because its input terminal is connected to the clock signal connection CLK via two other cascaded gates, more precisely via NAND gates N4 and N8.

The inverter I3 is allocated the logical depth 2 because the shortest connection to the clock signal connection CLK contains two other cascaded gates, more precisely NAND gates N7 and N9.

The inverter I4 is allocated the logical depth 3 because the shortest connection to the clock signal connection CLK contains three other cascaded gates, more precisely NAND gates N4 and N8 and the inverter I2.

The NAND gate N10 is allocated the logical depth 3 because the shortest connection to the clock signal connection CLK contains three other cascaded gates, more precisely NAND gates N7 and N9 and the inverter I3.

The inverter I5 is allocated the logical depth 4 because the shortest connection to the clock signal connection CLK contains four other cascaded gates, more precisely NAND gates N7, N9 and N10 and the inverter I3.

It is then assumed that circuit sections or gates having different logical depths switch at different times, more precisely with different delays with respect to the clock signal, and that circuit sections having the same logical depths switch at the same time.

As mentioned above, in each case a number of or all circuit sections of the circuit sections which change or can change their output signal at the same time are replaced by a single equivalent inverter of corresponding size, where switching at the same time means that the inverters switching at the same time switch with the same delay with respect to the clock signal. Accordingly, a number of or all circuit sections which are allocated the same logical depth are in each case replaced by a correspondingly dimensioned single equivalent inverter in this step.

Figure 2:
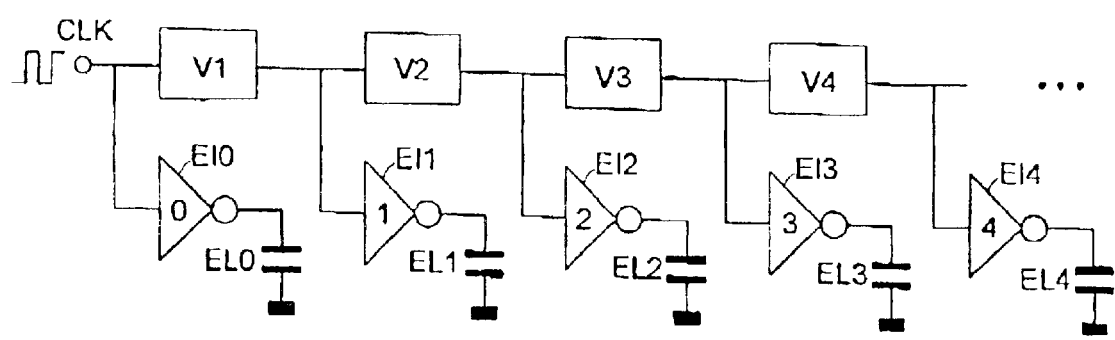
FIG. 2 shows a diagram of an equivalent circuit which can be used for calculating the current drawn by the circuit of FIG. 1 during its operation.

Referring now to FIG. 2, there is shown an example of a resultant equivalent circuit. The equivalent circuit shown in FIG. 2 consists of delay elements V1 to V4, equivalent inverters EI0 to EI4, and equivalent loads EL0 to EL4.

The equivalent inverter EI0 replaces the circuit sections to which the logical depth 0 is allocated; the equivalent inverter EI1 replaces the circuit sections to which the logical depth 1 is allocated; the equivalent inverter EI2 replaces the circuit sections to which the logical depth 2 is allocated; the equivalent inverter EI3 replaces the circuit sections to which the logical depth 3 is allocated; the equivalent inverter EI4 replaces the circuit sections to which the logical depth 4 is allocated.

The equivalent inverter EI0 receives the clock signal supplied to the configuration according to FIG. 1 via the clock signal connection CLK as input signal. This clock signal is also supplied to the first delay element V1. The delay element V1 delays the clock signal by a gate delay period and outputs the resultant delayed clock signal to the equivalent invert EI1 and the delay element V2. The delay element V2 delays the clock signal supplied to it by a gate delay period and outputs the resultant delayed clock signal to the equivalent inverter EI2 and the delay element V3. The delay element V3 delays the clock signal supplied to it by a gate delay period and outputs the resultant delayed clock signal to the equivalent inverter EI3 and the delay element V4. The delay element V4 delays the clock signal supplied to it by one gate delay period and outputs the resultant delayed clock signal to the equivalent inverter EI4.

The equivalent inverter EI0 thus receives as input signal the undelayed clock signal, the equivalent inverter EI1 receives as input signal the clock signal delayed by one gate delay period, the equivalent inverter EI2 receives as input signal the clock signal delayed by two gate delay periods, the equivalent inverter EI3 receives as input signal the clock signal delayed by three gate delay periods and the equivalent inverter EI4 receives as input signal the clock signal delayed by four gate delay periods. The gate delay periods correspond to the average signal delay for the circuit sections and can be empirically determined (by measurements on another digital circuit implemented in the same technology), or estimated, for the technology wherein the digital circuit is to be implemented.

The output terminals of the equivalent inverters EI0 to EI4 are connected to the positive or negative pole of the supply voltage supplying the configuration with power via the equivalent loads EL0 to EL4.

In the example considered, the equivalent loads are capacitive loads, i.e. loads containing one or more capacitors. However, they can additionally or alternatively also contain resistive and inductive components.

An equivalent load in each case corresponds to the sum of the loads to be driven by the gate replaced by the relevant equivalent inverter. In the example considered, the equivalent load is determined by determining the average load generally to be driven by a gate during a switching operation;

determining the number of gates of the gates exhibiting the same logical depth which actually switch at the same time (of the gates exhibiting the same logical depth, only a particular part performs a switching operation per clock pulse of the clock signal; the remainder retains its output signal unchanged); and multiplying the average load determined in the first step by the number determined in the second step.

The average load can be determined empirically (by measurements on another digital circuit implemented in the same technology) or estimated for the technology wherein the digital circuit is to be implemented.

In the example considered, the number of gates of the gates exhibiting the same logical depth which actually switch at the same time is determined by an estimate. In the present case, it is assumed that of the gates exhibiting the same logical depth, in each clock period, a third switches from the high level to the low level,
a third switches from the low level to the high level, and
a third does not perform a switching operation.

However, the number of gates of the gates exhibiting the same logical depth which actually switch at the same time can also be determined by simulating the operation of the digital circuit. For this purpose, it is examined (for example by using the net list) which gates switch under what conditions. Since it is not necessary to use a back-annotated net list for this purpose, such a simulation can be performed with relatively little expenditure. Such a simulation makes it possible to determine precisely what percentage of the gates exhibiting the same logical depth behaves in what manner. If the equivalent loads which, incidentally, can also vary with time, are determined on the basis of such a simulation, the equivalent loads can be specified with very good agreement with the loads actually occurring.

Independently of this, it can be provided that circuit sections driving particularly high or particularly low loads, for example bus drivers or long bus lines, are treated separately.

The equivalent inverters are dimensioned in such a manner that they are capable of driving the respective equivalent loads.

The equivalent circuit described makes it possible to determine with relatively high accuracy what currents are drawn by the digital circuit under what conditions.

To take into account that the gates replaced by an equivalent inverter in some cases switch from the high level to the low level and in some cases from the low level to the high level and in some cases not at all, the equivalent inverters are preferably in each case implemented by a number of equivalent inverters. In the text which follows, the case is described where each of the equivalent inverters EI0 to EI4 consists of two inverters.

The inverters forming an equivalent inverter, for example the equivalent inverter EI1, are shown in FIG. 3 and designated by the reference symbols EI11 and EI12.

The equivalent inverter EI11 replaces the gates, the output signal of which changes on switching from the 1 level to the 0 level, and the equivalent inverter EI12 replaces the gates, the output signal of which changes when switching from the 0 level to the 1 level. The inverters drive equivalent loads EL11 and EL12, respectively, which are connected to ground.

FIG. 4 shows a possible alternative to the equivalent inverters shown in FIG. 3. The equivalent inverters shown there and designated by reference numerals EI13 and EI14 can be used instead of the equivalent inverters EI11 and EI12 shown in FIG. 3.

The equivalent inverter EI13 corresponds to the equivalent inverter EI11 and the equivalent inverter EI14 corresponds to the equivalent inverter EI12. The difference, however, is how the equivalent load is connected: whereas the equivalent loads in the case of the equivalent inverters EI11 and EI12 are provided between the output terminals of the respective equivalent inverters and the negative pole of the supply voltage (ground), the equivalent load allocated to the equivalent inverter EI13 is connected to the positive pole of the supply voltage, and the equivalent load allocated to the equivalent inverter EI14 is connected to the negative pole of the supply voltage.

In principle, it would also be possible for the equivalent load EL13, too, or only the equivalent load EL14 to be connected to the positive pole of the supply voltage. It would also be conceivable for the equivalent inverters EI11 to EI14 to be replaced at least partially in each case by two inverters, one of which drives a load connected to the positive pole of the supply voltage and the other one of which drives a load connected to the negative pole of the supply voltage.

A simplification of the equivalent circuit is obtained if the equivalent inverters provided for the various logical depths are combined and are driven by a modified input signal (differing from the clock signal CLK). This makes it possible to replace even the most complex digital circuit by a few equivalent inverters.

Such an equivalent circuit is shown in FIG. 5. The equivalent circuit shown in FIG. 5 comprises equivalent inverters EIM1 and EIM2 corresponding to the equivalent inverters EI11 and EI12 according to FIG. 3, and an ideal inverter INV preceding the equivalent inverter EIM2. The equivalent circuit is supplied with an input signal Ue which differs from the clock signal CLK which is supplied to the digital circuit replaced by the equivalent circuit.

FIG. 6 shows possible variants of the input signal Ue. FIG. 6 shows:

the clock signal CLK which is supplied to the digital circuit replaced by the equivalent circuit;

a first variant, designated by Ue1, of the input signal Ue that can be used instead of the clock signal CLK in the equivalent circuit shown in FIG. 5; and a second variant, designated by Ue2, of the input signal Ue that can be used instead of the clock signal CLK in the equivalent circuit shown in FIG. 5.

The signal Ue1 also exhibits an edge at the point where the clock signal CLK exhibits an edge and, in addition, again exhibits the same edge after 1, 2, 3, 4, . . . gate delay periods. Ue1 is a periodic signal with a period corresponding to one gate delay period.

The signal Ue2 also exhibits an edge at the point where the clock signal CLK exhibits an edge and, in addition, again exhibits the same edge after even-numbered numbers of gate delay periods and an oppositely extending edge after odd-numbered numbers of gate delay periods. Ue2 is a periodic signal with a period corresponding to two gate delay periods.

The equivalent inverters EIM1 and EIM2 are:

used as equivalent inverter EI0 according to FIG. 2 on occurrence of the first edge in the input signal Ue1 or Ue2, respectively, used as equivalent inverter EI1 according to FIG. 2 on occurrence of the next edge in the input signal Ue1 or Ue2, respectively, occurring one gate delay period later, used as equivalent inverter EI2 according to FIG. 2 on occurrence of the next edge in the input signal Ue1 or Ue2, respectively, occurring one gate delay period later, used as equivalent inverter EI3 according to FIG. 2 on occurrence of the next edge in the input signal Ue1 or Ue2, respectively, occurring one gate delay period later, used as equivalent inverter EI4 according to FIG. 2 on occurrence of the next edge in the input signal Ue1 or Ue2, respectively, occurring one gate delay period later, etc.

When Ue1 is used as input signal Ue, the inverter INV is alternately connected to the input of the equivalent inverter EI1 and the equivalent inverter EI2; the changes occur in each case between two successive edges in Ue1, more precisely in each case after the end of the switching process triggered by the preceding edge and before occurrence of the next edge triggering the next switching process (at the times identified by dashed vertical lines in FIG. 6 in the example considered).

At those times, the equivalent inverters EIM1 and EIM2 and the loads driven by them are also matched. This matching is necessary because the equivalent inverters EI0 to EI4 and the loads driven by them, which are formed successively by the equivalent inverters EIM1 and EIM2 and the loads driven by them, are generally dimensioned differently. This applies both when Ue1 is used as input signal Ue and when Ue2 is used as input signal Ue.

The current drawn by a digital circuit can be determined in a simple, fast and accurate manner in the manner described above, that is to say by using an equivalent circuit of the type described above.

I claim:

1. A method for determining a current drawn by a digital circuit during an operation thereof, which comprises:

providing a circuit diagram of the digital circuit;

generating an equivalent circuit by replacing a number of circuit sections which change or can change their output signal levels simultaneously by an equivalent inverter; and determining the current to be drawn by the digital circuit during an operation thereof based on the equivalent circuit.

2. The method according to claim 1, wherein the step of generating the equivalent circuit comprises:

in a first step, partitioning the digital circuit into circuit sections each comprising a number of components;

in a second step, determining which of the circuit sections change or can change their output signal level at the same time; and in a third step, replacing at least some of the circuit sections which change or can change their output signal level at the same time by a single inverter.

3. The method according to claim 2, wherein the third step comprises replacing all of the circuit sections which change or can change their output signal level at the same time by a single inverter.

4. The method according to claim 1, wherein the circuit sections replaced by an inverter in the equivalent circuit have at least one input connection and an output connection.

5. The method according to claim 1, wherein the circuit sections replaced by an inverter in the equivalent circuit are circuit sections representing logic gates.

6. The method according to claim 1, wherein the equivalent circuit is generated by replacing all circuit sections whose output signal level changes or can change from the low level to the high level at the same time, by a single inverter.

7. The method according to claim 1, wherein the equivalent circuit is generated by replacing all circuit sections whose output signal level changes or can change from the high level to the low level at the same time, by a single inverter.

8. The method according to claim 1, which comprises dimensioning the inverters of the equivalent circuit and loads driven thereby such a current flowing therethrough is approximately equal to a current flowing through the circuit sections replaced thereby and the loads driven thereby.

9. A method for determining a current drawn by a digital circuit during an operation thereof, which comprises:

providing a circuit diagram of the digital circuit;

determining circuit sections of the digital circuit whose output signal levels change or can change simultaneously;

generating an equivalent circuit by replacing a number of the circuit sections which change or can change their output signal levels simultaneously by an equivalent inverter; and determining the current to be drawn by the digital circuit during an operation thereof based on the equivalent circuit.

* * * * *